United States Patent
Cain et al.

(10) Patent No.: US 8,349,673 B2
(45) Date of Patent: Jan. 8, 2013

(54) METHOD OF PRODUCING PLURALITY OF ORGANIC TRANSISTORS USING LASER PATTERNING

(75) Inventors: Paul A. Cain, Cambridge (GB); Carl Hayton, Cambridge (GB); Anoop Menon, Cambridge (GB); Thomas M. Brown, Rome (IT)

(73) Assignee: Plastic Logic Limited, Cambridge (GB)

( * ) Notice: Subject to any disclaimer, the term of this patent is extended or adjusted under 35 U.S.C. 154(b) by 519 days.

(21) Appl. No.: 11/910,806

(22) PCT Filed: Apr. 3, 2006

(86) PCT No.: PCT/GB2006/001216
§ 371 (c)(1),
(2), (4) Date: Apr. 15, 2008

(87) PCT Pub. No.: WO2006/106312
PCT Pub. Date: Oct. 12, 2006

(65) Prior Publication Data
US 2008/0194056 A1    Aug. 14, 2008

(30) Foreign Application Priority Data
Apr. 5, 2005   (GB) .................................. 0506896.0

(51) Int. Cl.
*H01L 21/00*   (2006.01)
*H01L 21/84*   (2006.01)
(52) U.S. Cl. ................... 438/161; 438/99; 257/E21.596
(58) Field of Classification Search ............... 438/161, 438/99; 257/E21.596
See application file for complete search history.

(56) References Cited

U.S. PATENT DOCUMENTS

| | | | |
|---|---|---|---|
| 5,705,413 A * | 1/1998 | Harkin et al. | 438/155 |
| 5,728,592 A * | 3/1998 | Oki et al. | 438/161 |
| 6,620,719 B1 * | 9/2003 | Andry et al. | 438/597 |
| 2003/0039143 A1 * | 2/2003 | Ogane | 365/185.23 |
| 2003/0049942 A1 * | 3/2003 | Haukka et al. | 438/778 |
| 2004/0075155 A1 | 4/2004 | Huang et al. | |
| 2004/0232495 A1 | 11/2004 | Saito et al. | |
| 2004/0266054 A1 | 12/2004 | Brazis et al. | |
| 2005/0248260 A1 * | 11/2005 | Sellars et al. | 313/500 |
| 2006/0197225 A1 * | 9/2006 | Pan et al. | 257/757 |

FOREIGN PATENT DOCUMENTS

| | | |
|---|---|---|
| WO | 03/041184 A2 | 5/2003 |
| WO | 03/080285 A1 | 10/2003 |
| WO | 2004/047114 A2 | 6/2004 |

OTHER PUBLICATIONS

R. Parashkov et al., "Organic vertical-channel transistors structured using excimer laser", Applied Physics Letters, Dec. 6, 2004, pp. 5751-5753, vol. 85, No. 23.

* cited by examiner

*Primary Examiner* — Matthew Landau
*Assistant Examiner* — Daniel Luke
(74) *Attorney, Agent, or Firm* — Sughrue Mion, PLLC

(57) ABSTRACT

A method of producing a plurality of transistors each including a source/drain electrode pair comprising a conductor material and a channel comprising semiconductor material between the source and drain electrodes of said source/drain electrode pair; the method comprising (i) forming over a substrate at least a first layer of said conductor material or a precursor thereto and a second layer of said semiconductor material or a precursor thereto; and (ii) thereafter removing selected portions of at least said first and second layers so as to define at least two adjacent source/drain electrode pairs that are unconnected to each other within said first and second layers.

19 Claims, 9 Drawing Sheets

METHOD OF PRODUCING PLURALITY OF ORGANIC TRANSISTORS USING LASER PATTERNING

CROSS REFERENCE TO RELATED APPLICATIONS

This application is a National Stage of International Application No. PCT/GB2006/001216 filed on Apr. 3, 2006, claiming priority based on British Patent Application No. 0506896.0, filed Apr. 5, 2005, the contents of all of which are incorporated herein by reference in their entirety.

The present invention relates to a method of producing a plurality of transistors. In one embodiment, it relates to a method for reducing current leakage between proximate organic thin film transistors by a process of high resolution semiconductor patterning using a laser ablation technique.

In order to produce an integrated electronic circuit, such as an organic semiconductor-based thin film transistor (TFT) array for an active matrix display, with good pixel selectivity, the semiconducting layer must be patterned. This will ensure that crosstalk between pixels is minimized, allowing the pixels to be charged independently of each other. In a device using unpatterned semiconductor material, current leakage between devices may occur, for example, between the interconnect lines that have been addressed and the pixel electrodes that have not been addressed. A common problem responsible for interpixel leakage currents is the formation of parasitic TFTs formed underneath interconnect lines and other electrodes that run through regions of the substrate in which a semiconducting layer is present. When a voltage is applied to the interconnect lines/electrodes an accumulation layer can be formed in the semiconducting layer underneath resulting in formation of a parasitic TFT and flow of undesirable leakage current. Parasitic TFT's and interpixel leakage currents in active matrix TFT arrays may be caused predominantly by the need for a storage capacitor whose upper plate is formed by a gate electrode whilst the gate electrode is held at constant voltage. When a neighbouring gate is activated, leakage can occur between pixels that are bridged by the semiconductor and the activated gate, since the semiconductor is switched 'on' by the gate voltage.

Therefore, the removal of semiconducting material from in between pixel electrodes isolates transistors within an array, and prevents current leakage within a circuit.

A variety of techniques have been used in the prior art to pattern the active semiconducting layer of an organic semiconductor based TFT circuit, such as direct-write printing, such as inkjet printing (see Paul, Appl. Phys. Lett. 83, 2070 (2003), or selective dewetting (Chabinyc, Appl. Phys. Lett. 81, 4260 (2002). or photolithographic patterning (Kymissis, J. Vac. Sci. Technol. B 20, 956 (2002). Printing based patterning techniques have resolution limitations, while photolithographic patterning may be incompatible with the solubility characteristics of the organic semiconductor, and may results in degradation of materials performance.

Laser patterning is an alternative patterning technique, which is particularly useful technique for removing small quantities of material, such as semiconducting material to isolate transistors within an array. The laser used for this process is often an excimer laser, most preferably a pulsed excimer laser that irradiates the layer to be ablated in local spots on the substrate. In each exposure of the substrate to the laser beam, the laser irradiation removes material of the semiconductor layer from the substrate. An example of a use known in the prior art for pulsed excimer lasers is a method of drilling small holes, where all three dimensions of the hole are in the region of 100 µm. This technique is used, for example, to drill ink jet printer nozzles into polyimide tape. A similar set of low-volume removal processes may be formulated for the manufacture of thin film transistors for electronic devices, in particular over a large area for active matrix displays or other applications. Whilst a much larger area needs to be covered by the imaging, the depth of the feature to be defined is often in the region of 50 nm, so that the total volume of material to be removed is still small. However, a problem with laser ablation techniques for patterning of layers in multilayer structures containing a sequence of organic and inorganic materials is the poor selectivity of the ablation process. When a pattern in one layer of the structure is to be defined, this generally leads to damage to and materials removal from underlying layers. Another important problem with laser ablation techniques is the contamination of the surface by ablation debris. Debris can lead to particle defects causing breakdown and shorts across interlayer and gate dielectrics.

The object of the present invention is to provide an improved method for reducing current leakage between transistors.

According to a first aspect of the invention, there is provided a method of producing a plurality of transistors each including a source/drain electrode pair comprising a conductor material and a channel comprising semiconductor material between the source and drain electrodes of said source/drain electrode pair; the method comprising (i) forming over a substrate at least a first layer of said conductor material or a precursor thereto and a second layer of said semiconductor material or a precursor thereto; and (ii) thereafter removing selected portions of at least said first and second layers so as to define a pattern of selected electrical connections within said first and second layers between said transistors.

According to another aspect of the present invention, there is provided a method of producing a plurality of transistors each including a source/drain electrode pair comprising a conductor material and a channel comprising semiconductor material between the source and drain electrodes of said source/drain electrode pair; the method comprising (i) forming over a substrate at least a first layer of said conductor material or a precursor thereto and a second layer of said semiconductor material or a precursor thereto; and (ii) thereafter removing selected portions of at least said first and second layers so as to define at least two adjacent source/drain electrode pairs that are unconnected to each other within said first and second layers.

Embodiments of the invention are defined in claims 2, 3 and 5 to 19.

According to one embodiment of the present invention, the semiconductor is patterned by simultaneous laser ablation of portions of the semiconductor material, the conductor layer underneath, and one or more dielectric layers on top of the semiconductor layer. This process also eliminates the current leakage path from the semiconductor material but has a further advantage of preventing any ablation debris from contaminating the critical semiconductor/dielectric interface.

The technique of the present invention is especially important for devices where the ablation threshold of the materials of both the first and second layers are very similar. It allows the use of ablation conditions in which the ablation process is not capable of ablating the semiconducting layer selectively. It also overcomes the problems associated with the contamination of the substrate surface by ablation debris.

To help understanding of the invention, a specific embodiment thereof will now be described, by way of example only, with reference to the accompanying drawings, in which.

Figure 1:
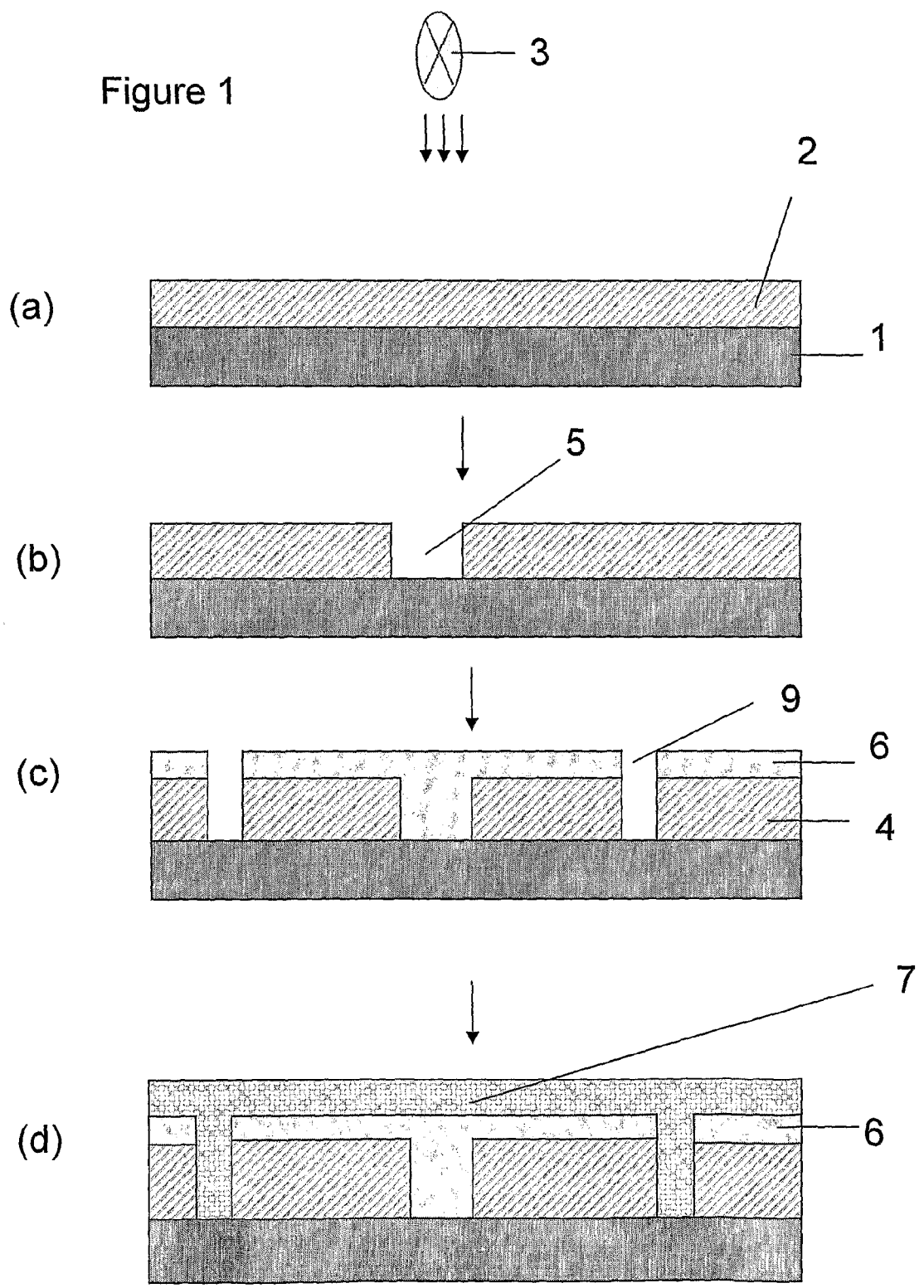
FIG. 1 illustrates processing steps for stack ablation of a semiconductor device by initially ablating a layer of conductive material on a substrate and then ablating through a stack of device layers according to an embodiment of the present invention.

With reference to the drawings, the first embodiment of the present invention is illustrated in FIG. 1. On a substrate a layer of conductive material is provided. A laser ablation technique is employed to ablate portions of the said layer of conductive material. Continuous layers of semiconductor and insulating material are then deposited on top of the ablated conductive material. A further process of laser ablating through all of the layers of the device to the substrate surface is then conducted, resulting in isolating the transistors within a circuit board.

A substrate 1 is coated with a layer of conductive material 2. The substrate may be either glass or a polymer film. According to one example, the substrate is a plastic substrate, such as a film of polyethyleneterephtalate (PET) or polyethylenenaphtalene (PEN). A first conductive layer 2, which is preferably a metallic layer, and most preferably a layer of inorganic metal such as gold or silver may also be used or any metal that adheres well to the substrate. A bilayer structure may be deposited, including a seed or adhesion layer in between the layer of metallic material and the substrate. Alternatively, a conductive polymer may be used, such as polyethylenedioxythiophene doped with polystyrene sulfonic acid (PEDOT/PSS). The conductive layer is preferably coated from solution by standard thin film coating techniques, including but not limited to, spin, dip, blade, bar, slot-die, or spray coating, inkjet, gravure, offset or screen printing. The said conductive material will form the basis for the source and drain electrodes of the transistor device.

Figure 2:
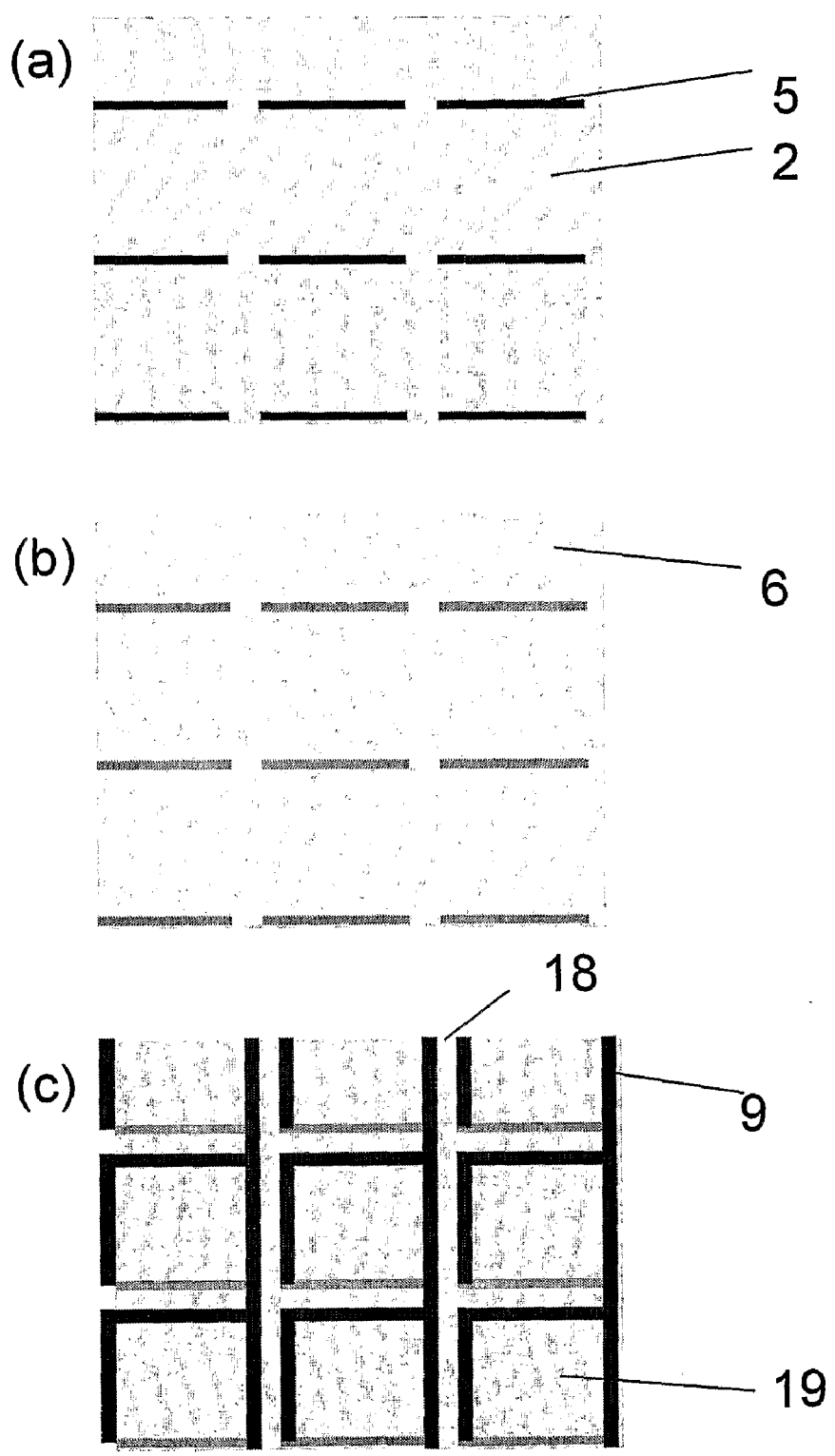
FIG. 2 shows a stack ablated semiconductor device from a top view, complete with gate electrodes.

A portion of the conductive material may then be patterned by techniques such as laser ablation, optical lithography and wet etching. For example, the channel region of the TFT can be defined in this first step, while leaving the remaining portion of the film unpatterned. FIG. 2 (a) shows a schematic of the above process, showing the device layout, and indicating the TFT channel 5 defined by optical lithography and etch back on the gold layer 2. This process is used to define the conductive material to form the channel 5 regions of the device.

A semiconductor layer 6 is then deposited on top of the ablated conductive layer, covering both the ablated regions and the remaining features of the conductive material 4, as is shown in FIG. 1 (c). The semiconductor material may be an organic semiconductor material, such as poly(dioctylfluorene-co-bithiophene) (F8T2), poly(9,9'-dioctylfluorene-co-bis-N,N')-(4-butylphenyl)diphenylamine (TFB) or other organic semiconducting materials known in the literature. The material may be deposited from solution by standard thin film coating techniques, including but not limited to spin, dip, blade, bar, slot-die, or spray coating, inkjet, gravure, offset or screen printing. However, the semiconductor is preferably deposited by the technique of spray or spin coating, or by inkjet printing. The solution concentration and spin conditions were chosen so as to produce a dry solid film of semiconductor of a thickness preferably in the region of ~50 nm.

FIG. 2 (b) shows the device once the semiconductor 6 has been deposited.

The stack of conductive material and semiconductive material is then ablated to form the trenches 9, as in shown in FIG. 2 (c). In this way an interconnect line 18 connecting to the TFT source electrode and a pixel electrode 19 linked to the TFT drain electrode are defined. In a preferred technique of laser ablation, a pulsed laser beam produced by an excimer laser (248 nm KrF, Lambda Physik LPX220i) is used to pattern a pixel structure and the source lines within the conductive material, and the semiconductor around the pixel electrodes simultaneously, as is shown in FIG. 1 (c). The laser beam is focused on the substrate at a wavelength which is capable of ablating both the layer of semiconductor material and the underlying conductive material. For multilayers involving polymers it can be difficult to selectively ablate an upper organic semiconducting layer without ablating an underlying metal layer. Gold, for example, is highly absorbing at the energies required for ablation of the organic semiconducting materials, and we have found that there is a too narrow process window for selective ablation of the organic semiconductive material without ablation of the underlying metal electrode structures. In the present process the two layers are ablated simultaneously which widens considerably the process window. The use of gold as the conductive material to be ablated in the same step has the additional advantage of ensuring that all of the overlying semiconducting material is removed as a result of the ablation of the gold material. As gold is highly absorbing, its use also allows for a wider range of wavelengths to be used and therefore adds a degree of flexibility to the process.

The chosen material to be ablated must be capable of absorbing the radiation of the laser beam at the chosen wavelength. The absorption coefficients of the preferred conductive material, gold and semiconductive material, TFB, are $7.55 \times 10^7$ m$^{-1}$ and $5 \times 10^6$ m$^{-1}$ respectively at 248 nm, illustrating that roughly half of the radiation is absorbed by each layer. The fluence used to perform the ablation was a single shot of the 30 ns pulse length laser (248 nm), at a fluence 140 mJ/cm$^2$. This process cleanly removes both the gold and semiconductor material as in shown in FIG. 3.

The resultant ablation of the above mentioned semiconductive and conductive material provides the required isolation of neighbouring transistors that is necessary to remove crosstalk and prevent any leakage currents between devices. The ablation of both the semiconductor and the underlying conductive material may be used to create both the pixel pattern and the interconnect lines. At this stage, the semiconductor material is only present within the defined channels 5 and on top of the deposited conductive regions of the transistor, but not in between devices. This ensures that there will not be any electrical shorting within the device as a result of the semiconductor material. The patterned semiconductor material above the underlying conductive regions is not active and is not causing any current leakage paths. Trenches 9 have now been produced from the semiconductor layer through to the substrate. As is seen in FIG. 1 (*c*), a further feature of this embodiment is that the semiconductive material is now self-aligned to the conductive material A dielectric layer 7 may then be deposited from solution in the form of a continuous layer onto the active semiconductor layer 6 of the device, as is shown in FIG. 1 (*d*). Techniques may be used, such as, standard thin film coating techniques, including but not limited to spin, dip, blade, bar, slot-die, or spray coating, inkjet, gravure, offset or screen printing. However, preferably, the technique of spray coating is used. The dielectric material may also be deposited using vapour phase deposition techniques like evaporation or chemical vapour deposition. This requires careful adjustment of the solvents of the underlying layers in order to avoid dissolution or swelling of the semiconducting layer.

The dielectric material must be deposited in such a way so that no degradation occurs to the underlying layers, such as the technique disclosed in WO01/47043, which involves depositing a first material from solution in a first solvent to form a first layer of the transistor; and subsequently whilst the first material remains soluble in the first solvent, forming a second layer of the transistor by depositing over the first material a second material from solution in a second solvent in which the first material is substantially insoluble.

Suitable solution processable dielectric materials that may be used are polystyrene dissolved in xylene, polymethylmethacrylate (PMMA) in ethylacetate or polyisobutylene (PIB). Alternatively, the gate dielectric may be deposited by vapour deposition. Parylene is an example of a dielectric material that may be deposited via chemical vapour phase deposition.

Figure 3:
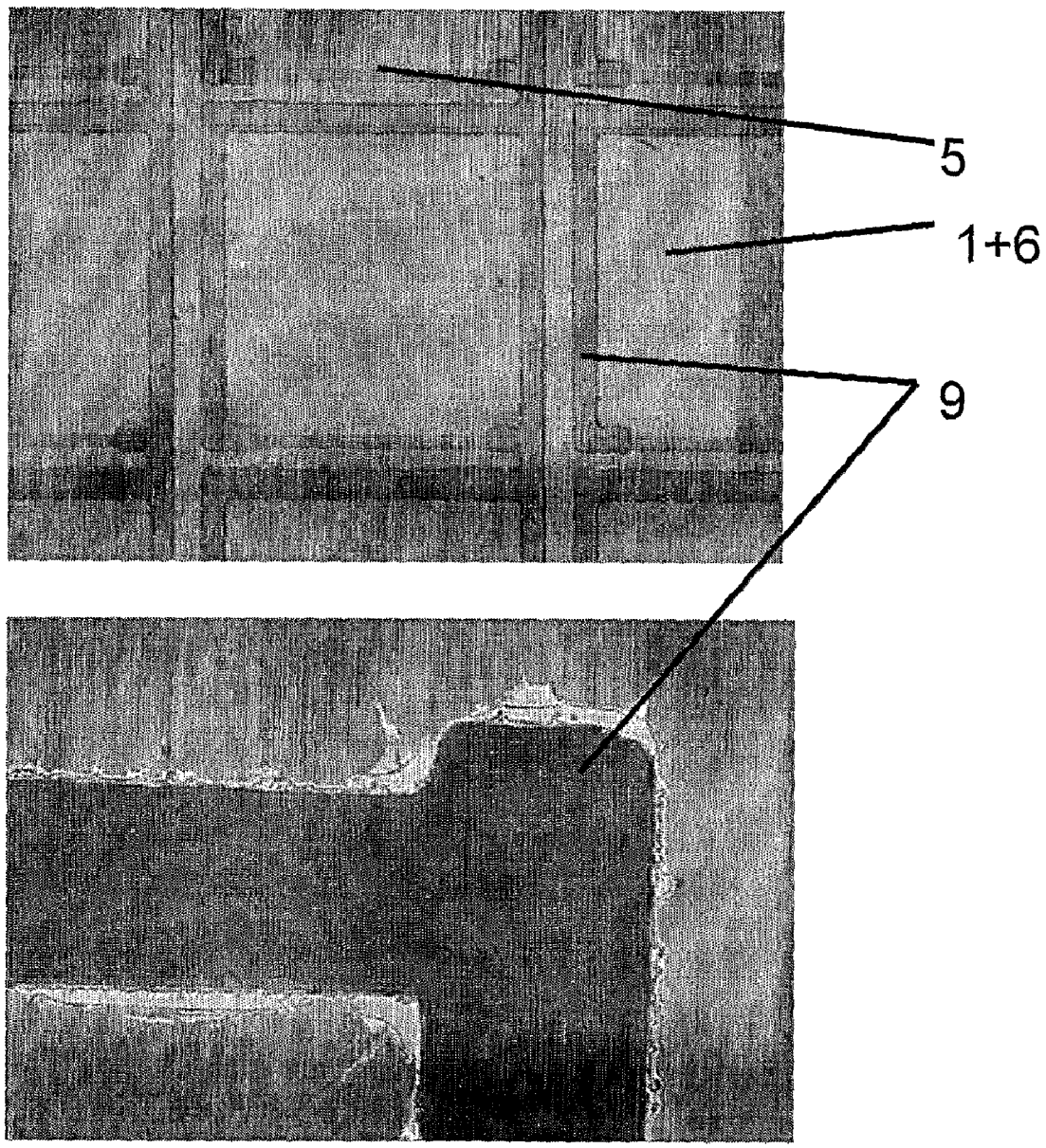
FIG. 3 shows an example of an actual semiconductor device that has been patterned using a method according to an embodiment of the present invention.

FIG. 3 shows a micrograph illustrating an example of an actual semiconductor device that has been patterned using the method described above. In this figure the semiconductor layer 6 may be seen that has been deposited on the substrate. The trenches 9, resulting from the stack ablation of the conductive material and the semiconductor layer are clearly shown.

Figure 4:
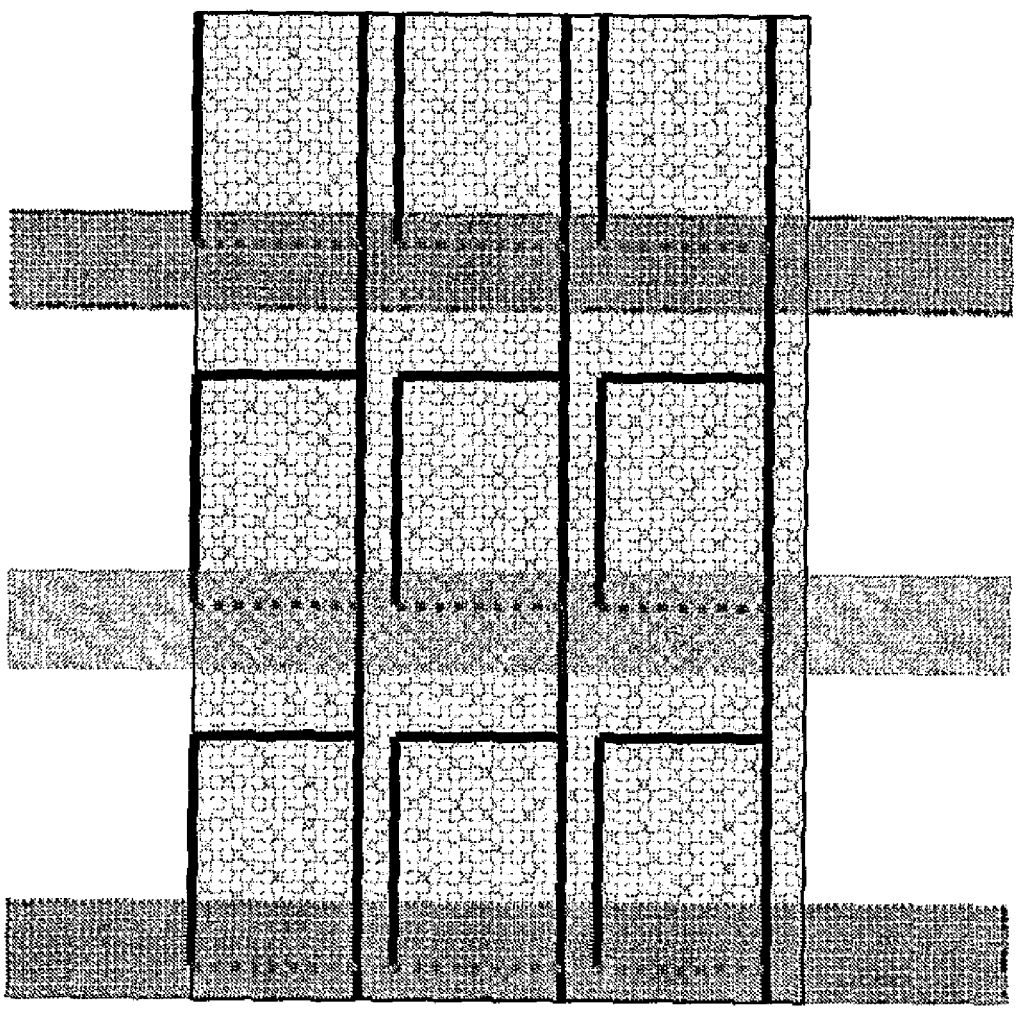
FIG. 4 shows the deposition of the gate interconnect lines within a semiconductor device.

The deposition of the dielectric layer is then followed by the deposition of a gate electrode and interconnect lines. The gate electrode may be gold or printable inorganic nanoparticles of silver, or a conducting polymer such as PEDOT/PSS. The gate electrode is deposited using techniques such as sputtering or evaporation techniques or solution processing techniques such as spin, dip, blade, bar, slot-die, gravure, offset or screen printing. Preferably, the gate electrode is deposited by ink jet printing, as can be seen in FIG. 4. Alternatively, the gate electrode can also be defined by the selective laser ablation Process (SLAP), which is capable of selectively patterning a metal layer on top of polymer multilayer structure, as in GB0513915.9. The technique of SLAP is a method of producing fine features of a device using short pulse lasers for the fabrication of thin film transistor (TFT) structures. This technique incorporating laser ablation uses single shots per image area of a short pulse laser to pattern layers of metallic material on top of underlying layers in order to produce fine features of a TFT device. An example is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing all of the energy of an ultra-short laser beam to enter the material and to be absorbed within the layer to be ablated which will result in the act of ablation before any substantial thermalization actually occurs. In addition, this technique may be used to finely tune the source and drain electrode formation after a coarser laser ablation process, resulting in the substantial elimination of burring edges that could lead to electrical shorts. In addition, this technique is able to be used to remove small areas of unwanted conductive material, for example, those that have been formed as a result of the production of debris.

Figure 5:
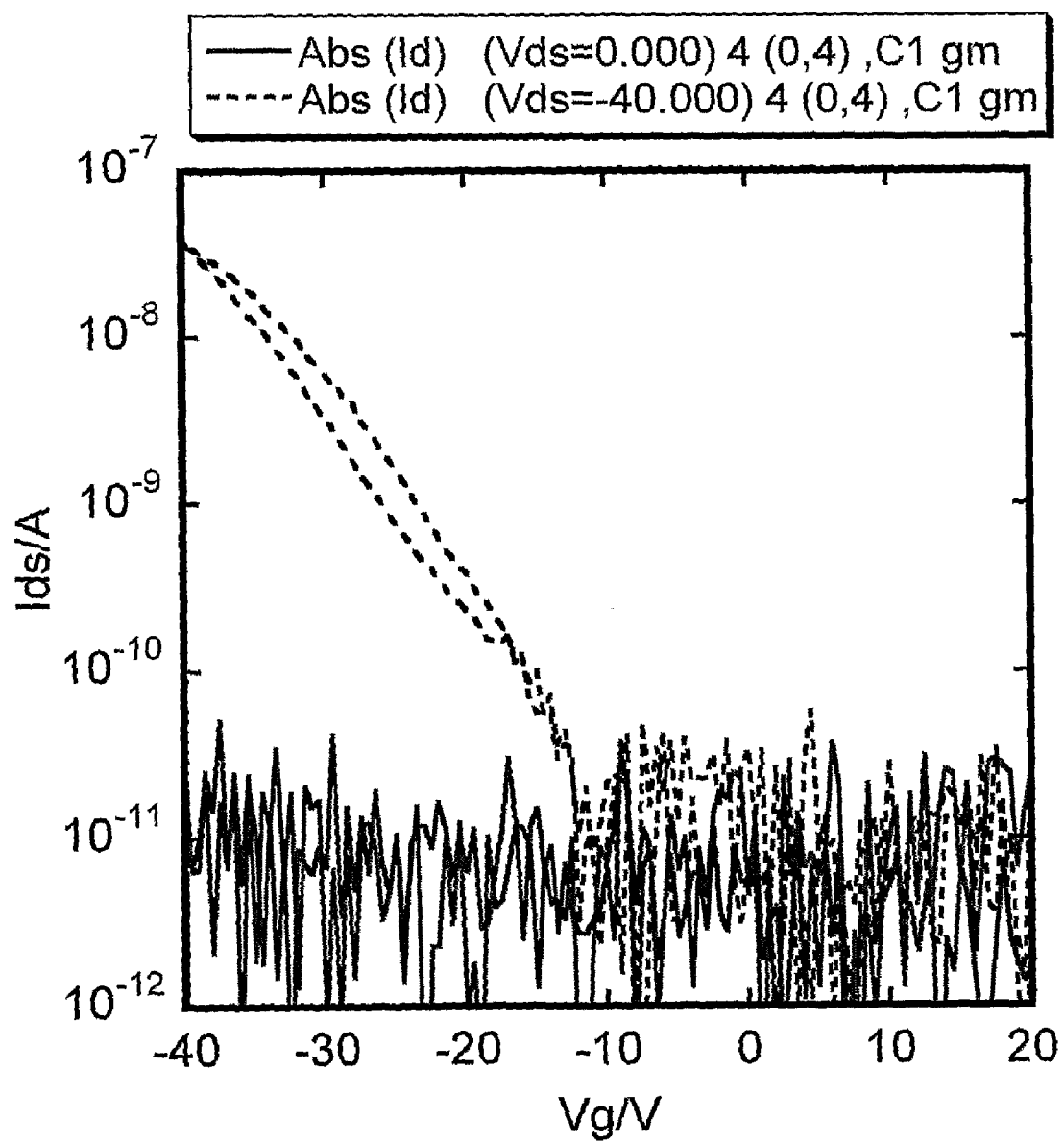
FIG. 5 shows the transfer curve of one of these devices, measured at Vds=0V and Vds=−40V.

FIG. 5 shows the transfer curve of a polymer TFT fabricated in this way, measured at $V_{ds}=0V$ and $V_{ds}=-40V$.

Figure 6:
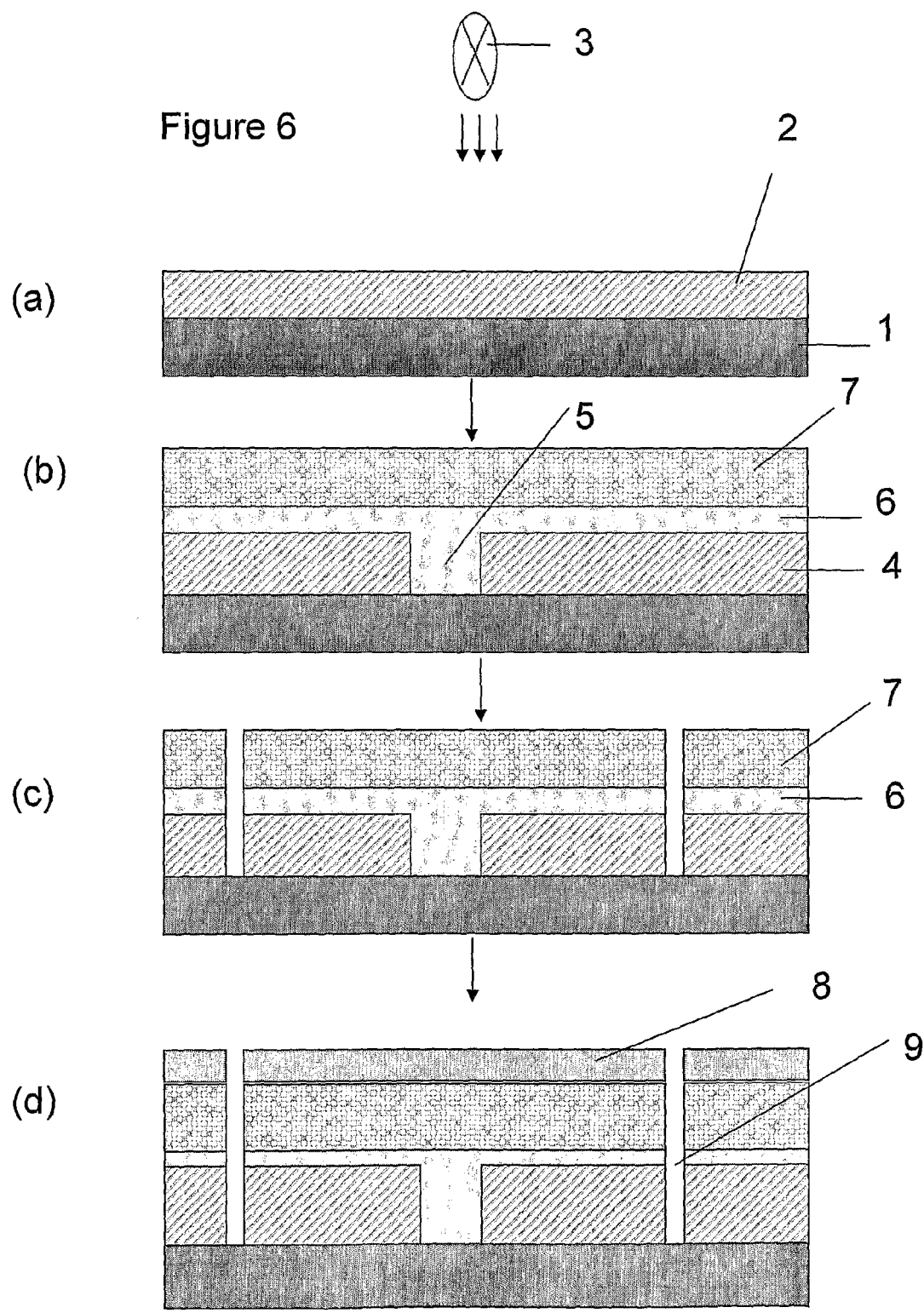
FIG. 6 illustrates a method of forming a semiconductor device according to an embodiment of the present invention where the second ablation step is performed after the deposition of layers of semiconducting and dielectric material. This process has the advantage of protecting the semiconductor/dielectric interface from the formation of debris.

A second embodiment that eliminates the current leakage path from the semiconductor material but has a further advantage of reducing the amount of debris produced by the above described process is illustrated in FIG. 6. This process has the advantage of protecting the semiconductor/dielectric interface from the formation of debris, as is explained below.

A substrate 1 is coated with a layer of conductive material 2. The substrate may be either glass or a polymer film. According to one example, the substrate is a plastic substrate, such as a film of polyethyleneterephtalate (PET) or polyethylenenaphtalene (PEN). A first conductive layer 2, which is preferably a metallic layer, and most preferably a layer of inorganic metal such as gold or silver may also be used or any metal that adheres well to the substrate. A bilayer structure may be deposited, including a seed or adhesion layer in between the layer of metallic material and the substrate. Alternatively, a conductive polymer may be used, such as polyethylenedioxythiophene doped with polystyrene sulfonic acid (PEDOT/PSS). The conductive layer is preferably coated from solution by standard thin film coating techniques, including but not limited to, spin, dip, blade, bar, slot-die, or spray coating, inkjet, gravure, offset or screen printing. The said conductive material 4 will form the basis for the source and drain electrodes of the transistor device.

The channels of the TFT array are patterned into the conductive layer, as shown in FIG. 6 (*b*), and described in more detail above (see FIG. 2). A portion of the conductive material may then be patterned by techniques such as laser ablation, optical lithography and wet etching. FIG. 2 (*a*) shows a schematic of the above process, showing the device layout, and indicating the TFT channel 5 defined by optical lithography and etch back on the gold layer 2. This process is used to define the conductive material to form the channel 5 regions of the device. Preferably, the conductive material is ablated upon absorption of radiation from the excimer laser 3. As described above, the deposited conductive material is preferably capable of absorbing in the region of 248 nm KrF. In the areas of the conductive layer that are subjected to a laser beam, the conductive material is capable of being ablated at the above wavelength of the laser beam used, resulting in the exposure of the substrate surface 5, to produce a channel area of the device.

The semiconductor material 6 is then deposited over the patterned conductive layer. As stated above, the semiconductor material is preferably F8T2 or TFB and may be deposited from solution by standard thin film coating techniques, including but not limited to spin, dip, blade, bar, slot-die, or spray coating, inkjet, gravure, offset or screen printing.

A gate dielectric layer of dielectric material 7 is then deposited. This first layer of dielectric material, which is selected to exhibit optimum charge transport properties of the organic semiconducting material at the active semiconductor-dielectric interface, provides protection of the semiconductor-dielectric interface from debris formed during the ablation procedure. It also provides some protection against chemical degradation of the semiconducting material during the ablation process in adjacent regions of the substrate.

The gate dielectric layer might also be deposited as a double layer with a second dielectric layer 8 deposited on top. If the thin dielectric layer 7 is a low-k dielectric to optimize charge transport properties of the interface, the second dielectric layer 8 might be a high-k dielectric chosen to increase the capacitance of the gate dielectric. The dielectric layers 7, 8, may be deposited from solution in the form of a continuous layer onto the active semiconductor layer of the device, by techniques such as, standard thin film coating techniques, including but not limited to spin, dip, blade, bar, slot-die, or spray coating, inkjet, gravure, offset or screen printing. Preferably, the technique of spray or spin coating is used. Preferred materials for the dielectric layer(s) are polystyrene, polymethylmethacrylate (PMMA) or polyisobutylene.

Figure 7:
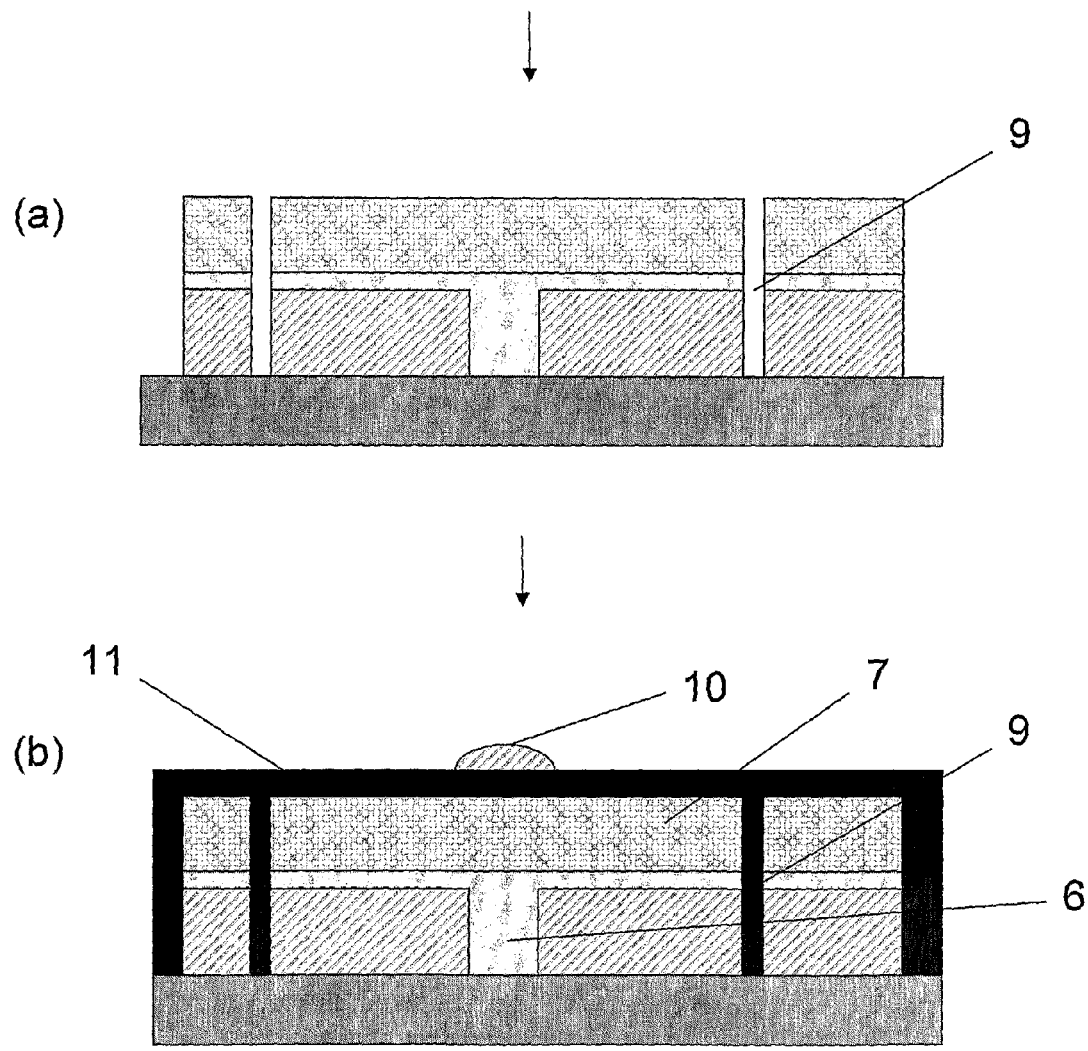
FIG. 7 illustrates a method of forming a semiconductor device according to an embodiment of the present invention where the second ablation step is performed after the deposition of layers of semiconducting and dielectric material. A final dielectric layer is deposited to prevent the gate electrode shorting with the earlier deposited source and drain electrodes.

A pulsed laser beam 3 is then used during the ablation process. In this embodiment, the laser beam ablates through the layers of the conductive material, the semiconductor material and the dielectric layer in one step (see FIG. 6 (c, d)). Any debris that is produced during the ablation process will land on top of the dielectric layer 7, 8 as opposed to the semiconductor/dielectric interface. A final dielectric layer 11 is then coated onto the substrate on top of the initial dielectric layer and ablated areas (see FIG. 7 (b)). The deposition of this final dielectric material is necessary to prevent the gate electrode 10 (see below) shorting with the earlier deposited source and drain electrodes. The final dielectric layer may also be solution processed by techniques such as, standard thin film coating techniques, including but not limited to spin, dip, blade, bar, slot-die, or spray coating, inkjet, gravure, offset or screen printing. As described above, care needs to be taken also to avoid solvent dissolution or swelling effects when the final dielectric material is deposited.

The gate electrode and the interconnects are then formed by the deposition of a conductive material, such as gold or printable inorganic nanoparticles of silver, but is preferably a conducting polymer, such as PEDOT/PSS. The gate electrode 10 is deposited using techniques such as sputtering or evaporation techniques or solution processing techniques such as spin, dip, blade, bar, slot-die, gravure, offset or screen printing. Preferably, the gate electrode is deposited by ink jet printing. Alternatively, the gate electrode can also be defined by the technique of selective laser ablation (SLAP), which is capable of selectively patterning a metal layer on top of polymer multilayer structure as described above and in GB0513915.9.

Alternatively, the initial dielectric layer 7 may act purely as a guard for the semiconductor/dielectric interface and may be removed immediately before applying further dielectric layers. In this case, either a single dielectric layer may be produced, or the first dielectric layer may be removed and the surface of the semiconductor cleaned to ensure there is not debris and then a fresh dielectric layer may be deposited. This could be done by application of the original solvent for the first dielectric material 7, which needs to be an orthogonal solvent for the semiconductor layer 6. In this way the initial dielectric layer acts as a debris mask that is later removed.

This first embodiment has an advantage over the second embodiment, in that better edge quality is achieved, as there is less material to be removed at each ablation step. For the second embodiment, as more layers are ablated in one step, more laser shots or a higher fluence is required. This also results in the process being slower, leading to a lower throughput. However, the second embodiment ensures that the dielectric/semiconductor interface is protected from the formation of debris, which could cause current leakage between transistors within an array, and generate electrical shorts through the gate dielectric layer.

Figure 8:
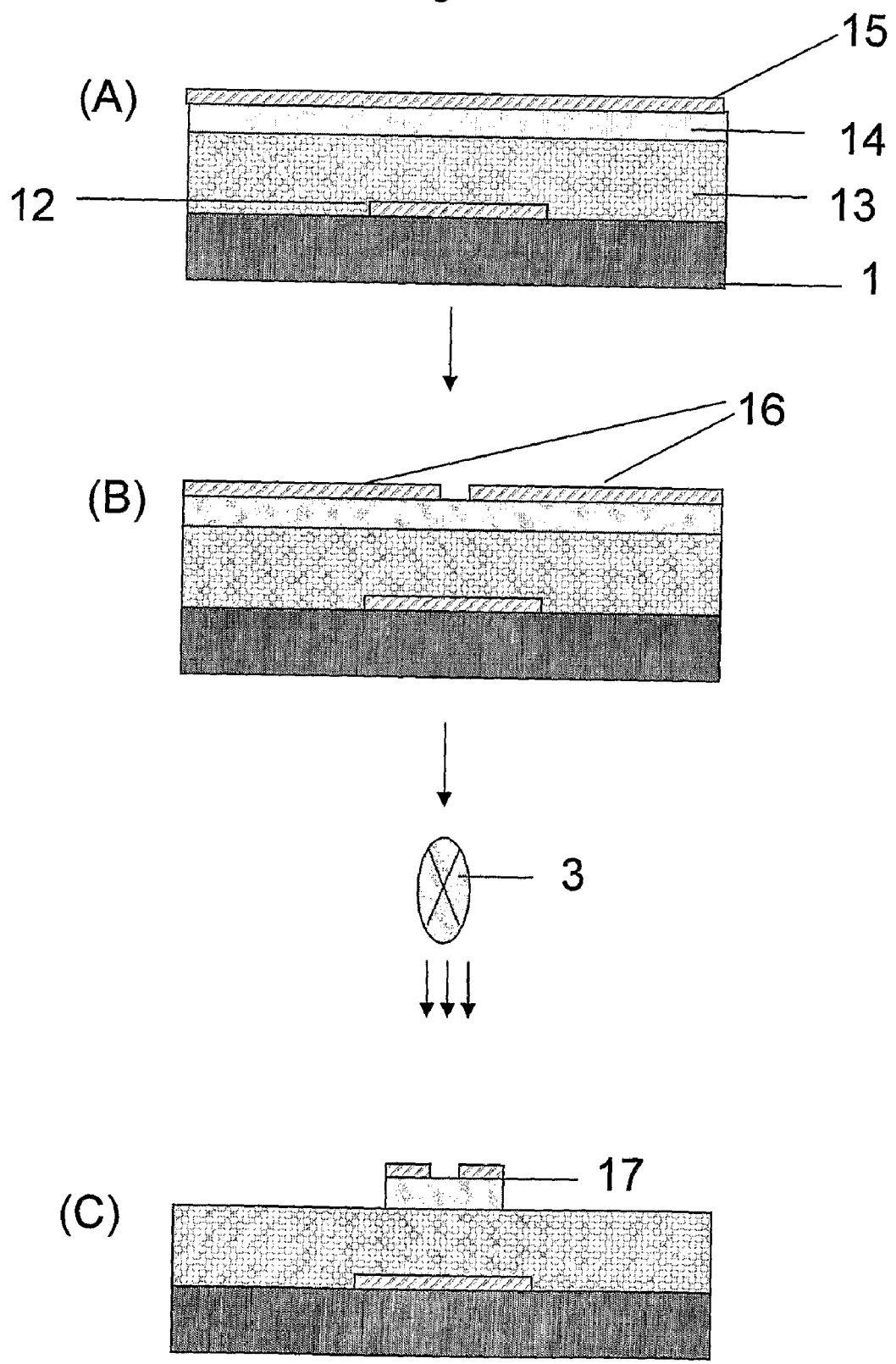
FIG. 8 illustrates a method for producing stacked bottom gate TFT according to an embodiment of the present invention where the source drain electrodes are partially patterned at the same time as the semiconductor.

The technique according to the present invention is also applicable, for example, to alternative device configurations, such as bottom-gate TFT configurations. A third embodiment of the present invention relates to a method of patterning a layer of semiconductor material within a transistor device using a process of laser ablation in the bottom-gate configuration. The device incorporates a layer of dielectric material and a layer of semiconductor material deposited over an underlying gate electrode. In FIG. 8, a conductive layer is deposited over the semiconducting layer before the semiconducting material is patterned.

A substrate 1 is coated with a layer of conductive material which forms the gate electrode 12. The substrate may be either glass or a polymer film. According to one example, the substrate is a plastic substrate, such as a film of polyethyleneterephtalate (PET) or polyethylenenaphtalene (PEN). The main requirement of the gate line 12 is for it to be electrically conductive. A wide variety of conductive materials may be used for the gate line. Layer 12 is preferably a metallic layer, and most preferably a layer of inorganic metal such as gold, Pt, Pd, Pt:Pd, W, Ti, aluminum or silver or any metal or combination of metals that adhere well to the substrate. For inorganic materials, nanoparticle inks are preferably used. These materials require post deposition treatment such as temperature curing or laser annealing to reach the required conductivities. Alternatively, a conductive polymer may be used, such as polyethylenedioxythiophene doped with polystyrene sulfonic acid (PEDOT/PSS). The gate electrode layer 12 can be deposited in its patterned form by techniques such as inkjet printing, shadow mask evaporation, soft lithography, gravure coating or other known techniques. The gate electrode may also be deposited in continuous form, by standard thin film coating techniques, including but not limited to, spin, dip, blade, bar, slot-die, or spray coating, inkjet, gravure, offset or screen printing, or by vacuum processing such as evaporation, sputtering or other vacuum techniques, and then subsequently patterned to its desired dimensions by techniques such as photolithography or laser ablation.

A dielectric layer 13 is then deposited over the substrate from solution in the form of a continuous layer. Techniques may be used, such as, standard thin film coating techniques, including but not limited to spin, dip, blade, bar, slot-die, or spray coating, inkjet, gravure, offset or screen printing. The dielectric material may also be deposited using vapour phase deposition techniques like evaporation or chemical vapour deposition. As the layer of dielectric material is spin coated directly onto the substrate rather than on the semiconductor layer, materials that are able to be cross-linked either thermally or by UV irradiation or by a combination of both of these can be employed. These materials include polyhydroxystyrene, polyimides, BCB, Accuflo, Avatrel 2195P or EP M. The ability to crosslink the dielectric will result in the dielectric becoming resistant to solvents, wet-etching processes and heat that may be used or generated during later processing steps, such as those used in photolithographic and/or laser ablation processes. Non-crosslinkable polymers can also be used for layer 13, including PMMA or lower dielectric constant dielectrics such as polystyrene or polyisobutene. The gate dielectric layer 13 may also be composed of a multilayer stack in order to improve the electronic, electrical and surface properties of the transistor (see above).

A continuous layer of semiconducting material 14 is then deposited over the dielectric layer by techniques such as spin or spray coating. Materials that may be used as the semiconducting layer include solution-processed materials, such as poly-9,9 dioctyl-fluorene-co-bithiophene and other polyfluorene based materials, such as polythiophenes, polytriarylamines. Alternatively, pentacene may be deposited through thermal evaporation techniques. Methods of deposition that may be used include, but are not limited to, inkjet printing, spray coating or offset printing.

Subsequently a conductive layer 15 is deposited onto the layered substrate over the semiconductor film 14. This conductive material layer may consist of a conducting polymer such as PEDOT/PSS, but is preferably a metalised layer, such as printable inorganic nanoparticles of silver (Ag) or most preferably gold (Au). The conductive layer is preferably coated from solution by standard thin film coating techniques, including but not limited to, spin, dip, blade, bar, slot-die, or spray coating, inkjet, gravure, offset or screen printing, but may also be deposited by vapour phase deposition, such as thermal evaporation or sputtering. The said conductive material is then patterned into separate source and drain contacts 16, using suitable patterning techniques such as photolithography, shadow mask evaporation, soft lithography, ink jet printing or other patterning techniques available. By forming separate source and drain electrodes the channel of the transistor is defined (see FIG. 8b).

The deposited semiconducting layer 14 and the (partially pre-patterned) conductive layer 16 are then patterned together into an active layer island 17 (see FIG. 8c), using a highly-focused laser beam that ablates away the desired regions of the semiconductor layer 14 and conductive layer 16 stack using an x-y scanning of the laser stage. This will leave a semiconductor pattern that minimises leakage paths to the periphery of the unit device which cause unwanted parasitic currents in transistor arrays such as those found in active matrix displays or in more complex logic circuits. The ablation power, laser wavelength, and number of shots are selected such that ablation of the underlying gate dielectric and gate line does not occur. This is also helped in particular by using a crosslinked gate dielectric layer.

The patterning of the semiconductor material occurs after the deposition of the source-drain electrodes. Therefore any debris that is caused by the ablative process required to pattern structure 17 does not negatively influence the electronic characteristics of the transistor, since the source-drain/semiconductor contacts and interfaces have already been formed and are thus protected by the source drain electrodes themselves. However, if the semiconductor material was patterned by an ablative process before the deposition of the source-drain contacts, any debris created on the semiconductor surface could cause failure or strongly affect the performance of the transistor upon subsequent deposition of the source-drain contacts.

Figure 9:
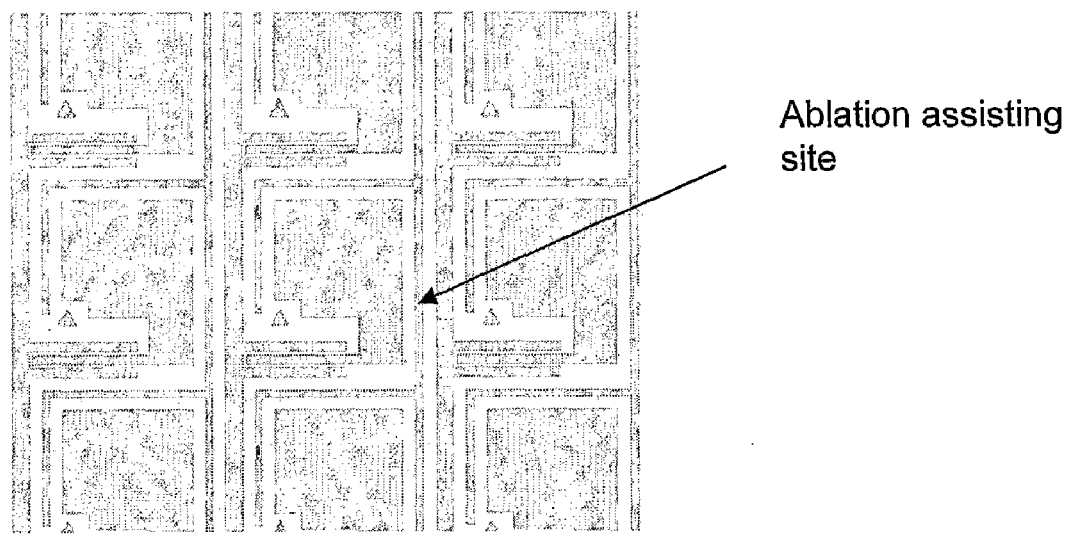
FIG. 9 illustrates the semiconductor ablation of the assisting site region of a TFT according to an embodiment of the present invention.

In a further embodiment of the invention as shown in FIG. 9, the initial photolithographic step that patterns the metallic source, drain and pixel regions is used to also pattern a thin gold line around most of the perimeter of the pixel and TFT, along the line where subsequent semiconductor patterning is to be performed. This is known as the ablation assisting site. This metallic line has an ablation threshold of around $F=100$ mJ/cm$^2$.

A layer of semiconductor material may then be deposited from solution by standard thin film coating techniques, including but not limited to spin, dip, blade, bar, slot-die, or spray coating, inkjet, gravure, offset or screen printing. However, the semiconductor is preferably deposited by the technique of spray or spin coating, or by inkjet printing. A pulsed UV laser is then used to pattern the semiconductor immediately above the ablation-assisting site.

If the optical density (absorbance) of the semiconductor layer is A, then a fluence of around $F \times 10^4$ is applied to the area of the ablation assisting site. Since A is usually small for a very thin layer of polymer semiconductor, the overall fluence required is likely to be ~100 mJ/cm$^2$. The metallic material is easily ablated and simultaneously removes the semiconductor material form the surface. This provides good electrical isolation between pixels, whilst ensuring that the fluence required to pattern the semiconductor is low, since all of the radiation is absorbed within the ablated semiconductor-metal stack. This is in contrast to patterning the semiconductor layer directly, where much of the laser energy is transmitted into the substrate material.

The processes and devices described herein are not limited to devices fabricated with solution-processed polymers. Some of the conducting electrodes of the TFT and/or the interconnects in a circuit or display device (see below) may, for example, be formed from inorganic conductors that can, for example, be deposited by printing of a colloidal suspension or by electroplating onto a pre-patterned substrate or by vacuum evaporation or sputtering.

For the semiconducting layer any solution processable conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nanowires (X. Duan, Nature 425, 274 (2003)). Vacuum-processable semiconducting materials such as molecular semiconductor or conventional inorganic semiconductor such as amorphous silicon might also be used.

Devices such as TFTs fabricated as described above may, for example, be part of a more complex circuit or device in which one or more such devices can be integrated with each other and/or with other devices. Examples of applications include logic circuits and active matrix circuitry for a display or a memory device, or a user-defined gate array circuit.

The patterning process may, for example, be used to pattern other components of such circuits as well, such as interconnects, resistors, capacitors etc.

The present invention is not limited to the foregoing examples. Aspects of the present invention include all novel and/or inventive aspects of the concepts described herein and all novel and/or inventive combinations of the features described herein.

The structures described above could, for example, be supplemented by other conductive and/or semiconductive structures on the same substrate, for example interconnects. Multiple structures as described above may be formed on the same substrate, and may be connected together by electrically conductive interconnects to form an integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of producing a plurality of transistors each including a source/drain electrode pair comprising a conductor material and a channel comprising organic semiconductor material between the source and drain electrodes of said source/drain electrode pair; the method comprising:
   (i) forming over a substrate at least a first layer of said conductor material or a precursor thereto, a second layer of said semiconductor material or a precursor thereto, and a protective layer over the first and second layers; and
   (ii) thereafter removing by laser ablation said first, second and protective layers together in selected regions in one step so as to define a pattern of selected electrical connections within said first and second layers between said transistors;
   wherein the protective layer provides protection for the first layer or the second layer from debris formed during said laser ablation.

2. A method according to claim 1, further comprising removing selected portions of said first layer so as to define said channels and/or other features of said first layer prior to forming said second layer over said first layer.

3. A method of producing a plurality of transistors each including a source/drain electrode pair comprising a conductor material and a channel comprising organic semiconductor material between the source and drain electrodes of said source/drain electrode pair; the method comprising:
   (i) forming over a substrate at least a first layer of said conductor material or a precursor thereto, a second layer of said semiconductor material or a precursor thereto, and a protective layer over the first and second layers; and
   (ii) thereafter removing by laser ablation at least said first, second and protective layers together in selected regions in one step so as to define at least two adjacent source/drain electrode pairs that are unconnected to each other within said first and second layers,
   wherein the protective layer provides protection for the first layer or second layer from debris formed during said laser ablation.

4. A method according to claim 3, wherein step (ii) is carried out so as to define a first series of interconnected source electrodes and a second series of interconnected source electrodes that are unconnected to said first series within said first and second layers.

5. A method according to claim 3, wherein step (ii) is carried out so as to define an array of drain electrodes for an array of respective transistors wherein each drain electrode is unconnected within said first and second layers to each and every other drain electrode adjacent thereto.

6. A method according to claim 1, wherein step (i) comprises forming said second layer over said substrate and said first layer.

7. A method according to claim 1, wherein the protective layer functions as a gate insulator layer in the transistors.

8. A method according to claim 7, wherein the protective layer comprises a first sub-layer and a second sub-layer formed over the first sub-layer.

9. A method according to claim 8, wherein the second sub-layer has a higher dielectric constant (k) than the first sub-layer.

10. A method according to claim 1, further comprising the step of removing the protective layer after step (ii).

11. A method according to claim 1, wherein said protective layer forms part of the gate dielectric of the transistor.

12. A method according to claim 11 further comprising forming a gate electrode on top of said gate dielectric layer.

13. A method according to claim 1, comprising the step of forming a dielectric layer on top of said first and second layer that covers at least portions of the region from which the first, second and protective layer were removed during step (ii).

14. A method according to claim 1, wherein step (i) comprises forming gate electrodes over a substrate; forming a gate insulator layer over said gate electrodes; and forming said first and second layers over said gate insulator layer.

15. A method according to claim 10, wherein said first layer is formed over said second layer.

16. A method according to claim 1, wherein the first and second layers are selected so as to have ablation thresholds that differ from each other by a factor of less than 100.

17. A method according to claim 1, wherein first and second layers are selected so as to have absorption coefficients at the laser wavelength that differ from each other by a factor of 20 or less.

18. A method according to claim 1, wherein said first layer is a patterned layer and defines said source/drain electrode pairs of said plurality of transistors, and said second layer defines said channels of said plurality of transistors.

19. A method according to claim 3, wherein said first layer is a patterned layer and defines said source/drain electrode pairs of said plurality of transistors, and said second layer defines said channels of said plurality of transistors.

* * * * *